United States Patent [19]
Kitayoshi

[11] Patent Number: 5,576,978
[45] Date of Patent: Nov. 19, 1996

[54] HIGH RESOLUTION FREQUENCY ANALYZER AND VECTOR SPECTRUM ANALYZER

[75] Inventor: Hitoshi Kitayoshi, Tokyo, Japan

[73] Assignee: Advantest Corporation, Tokyo, Japan

[21] Appl. No.: 246,252

[22] Filed: May 18, 1994

[51] Int. Cl.$^6$ .......................... G01R 23/00; G01R 23/16; G06F 17/10; G06G 7/30
[52] U.S. Cl. .................... 364/576; 364/485; 364/577; 364/726; 364/724.06; 324/76.19; 324/76.21
[58] Field of Search .................... 364/576, 485, 364/484, 577, 514 B, 572, 726, 724.06, 725, 485; 324/76.19, 76.21, 76.26

[56] References Cited

U.S. PATENT DOCUMENTS

| | | | |
|---|---|---|---|
| 3,920,978 | 11/1975 | Schmitt et al. | 235/156 |
| 4,057,756 | 11/1977 | Ley et al. | 324/77 B |
| 4,093,989 | 6/1978 | Flink et al. | 364/485 |
| 4,157,457 | 6/1979 | Sakoe et al. | 364/485 |
| 4,818,931 | 4/1989 | Naegeli et al. | 324/77 B |

OTHER PUBLICATIONS

Quirk et al., "A Wide–Band High–Resolution Spectrum Analyzer" IEEE Transactions on Acoustics, Speech, and Signal Processing vol. 36 No. 12, Dec. 1988, pp. 1854–1861.

"DSP Measurement of Frequency" by Eric Rosenfeld of LTX Corp., International Test Conferences 1986, pp. 981–986, IEEE.

"Wavelets and Signal Processing" by Olivier Rioul and Martin Vetterli, IEEE SP Magazine, pp. 14–24, Oct. 1991.

"High Resolution Technique for Short Time Frequency Spectrum Analysis" by Hitoshi Kitayoshi, Denshi Joho Tsushin Gakkai Ronbunshi A vol. J76–A No. 1 pp. 78–81, Jan. 1993.

*Primary Examiner*—James P. Trammell
*Assistant Examiner*—Hien X. Vo
*Attorney, Agent, or Firm*—Knobbe, Martens, Olson & Bear

[57] ABSTRACT

A high resolution frequency analyzer analyzes frequency spectra of an incoming analog signal based on a fast Fourier transformer at ultra-high resolution without increasing the sampling number or time data of the analog signal. This series of input time data representing the analog signal is provided to the fast Fourier transformer through a subtractor. The analyzer distinguishes a spread spectrum, due to fluctuations, from a true line spectrum in the frequency spectra output by the fast Fourier transformer. If the spectrum is found to be the true line spectrum, then true frequency, amplitude and phase of the line spectrum are accurately obtained by an interpolator. The line spectrum is accumulated by an accumulator and inversely converted by an inverse Fourier transformer provided in a feedback loop so as to feedback time base data to the subtractor. The time base data is subtracted by the input time data so that the remainder data is Fourier transformed. The line spectrum accumulated by the accumulator is vector-added to the output of the fast Fourier transformer, which establishes a high resolution frequency spectrum to be displayed on a display device.

10 Claims, 12 Drawing Sheets

FIG. 3

| i | $a_i$ | $f_i$ (Hz) | $0_i$ (deg) |
|---|-------|------------|-------------|
| 1 | 1.0   | 5.11       | 0           |
| 2 | 0.8   | 10.22      | 20          |
| 3 | 0.6   | 15.33      | 40          |
| 4 | 0.4   | 20.44      | 60          |
| 5 | 0.2   | 25.55      | 80          |

HIGH RESOLUTION FREQUENCY ANALYZER AND VECTOR SPECTRUM ANALYZER

FIELD OF THE INVENTION

The present invention relates to a frequency analyzer used for analyzing each kind of signal frequency, and more particularly, to a high resolution frequency analyzer for measuring the true frequency, amplitude and phase of a spectrum by improving the resolution.

BACKGROUND OF THE INVENTION

FIG. 12 shows a schematic view of a conventional frequency analyzer. When utilizing a conventional frequency analyzer, an analogue input signal V(t), whose frequency is to be analyzed, is first converted by an AD converter 1 to obtain digitized time base data. The time base data is stored in memory 2 and transferred to a window function weighting means 3 when needed. The weighting function is performed by multiplying the window function weighting means 3, for example the Hann window function, by the time base data. The weighted time base data is then input to in a Fast Fourier Transform (FFT) means 4. The time base data is transformed to the frequency domain data S(f) utilizing the FFT means. The frequency domain data S(f) is subsequently input to a display device 5. Finally, the frequency spectrum of the analogue input signal V(t) is displayed therein.

The following disadvantages are associated with the conventional frequency analyzer described above. First, if the time base data stored in memory 2 is set at T(second), the resolution of the analysis spectrum is 1/T(Hz). As a result, the frequency spectrum cannot be displayed at higher resolutions.

Second, the vector analysis-frequency obtained by the FFT means 4 is discrete [n/T(Hz): n is an integer]. If the frequency spectrum of the analogue input signal V(t) does not match n/T(Hz), the amplitude value of the analyzed frequency spectrum may be adversely altered.

Third, when performing a spectrum analysis utilizing a FFT means 4, there is no significance in having an absolute phase. In other words, the absolute phase of the spectrum cannot be measured utilizing FFT means.

The object of the present invention is to overcome the above listed disadvantages and provide a high resolution frequency analyzer, having higher resolution than conventional analyzers, which can precisely measure the amplitude and phase of the spectrum.

SUMMARY OF THE INVENTION

The present invention comprises a frequency analyzer which converts an analogue input signal utilizing an AD converter, stores the result of the AD conversion in memory, multiplies a preferred window function by the time base data which is transferred from memory utilizing a window function weighting means, and analyzes the frequency of the multiplied result utilizing a FFT means.

The high resolution frequency analyzer is further characterized by and includes the following. An interpolation judgment means is used for distinguishing between a line spectrum and a spread spectrum, which is spread by fluctuations in each frequency spectrum obtained by the FFT means, and utilizes interpolation to find the true line spectrum. A spectrum interpolation means is used for measuring true frequency, amplitude and phase of the spectrum which is found through interpolation utilizing the interpolation judgment means. An inverse Fourier transform means is used for inversely converting frequency domain data, interpolated by the spectrum interpolation means, into time base data. A subtractor is used for subtracting the inverted time base data, obtained by the inverse Fourier transform means, from the time base data read out from memory, and providing the subtracted result along with the window function weighting means to Fast Fourier Transform the subtracted result. An accumulation means is used for accumulating the frequency domain data interpolated by spectrum interpolation means. A summation means is used for vector-summing the frequency domain data accumulated in the accumulation means and subsequently transformed by the FFT means. A display device is used to display the summed result.

In the present invention, the interpolation judgment means allows the user of the device to find whether or not the frequency spectrum output from the FFT means is the true line spectrum. If the frequency spectrum is found to be the true line spectrum, then the true frequency, amplitude and phase of the line spectrum can be obtained utilizing a computer process. This processed frequency spectrum may be determined regardless of the discrete frequency n/T(Hz) of the FFT means. Thus, the true frequency, amplitude and phase of the spectrum can be obtained.

The frequency domain data, which is presumed to be true and correct, is accumulated by the accumulating means. The accumulated frequency domain data is then vector-summed and the summed result is given to the display device.

Therefore, in accordance with the present invention, the frequency, amplitude and phase of the spectrum are modified or interpolated so as to possess true and complete values. Further, for the spread part of the frequency spectrum, due to the fluctuations, the FFT output power is given to the display device as the measured value without interpolation.

Thus, the present invention allows one to obtain the frequency analysis result with high resolution because the line spectrum can be displayed as the line spectrum and its frequency, amplitude and phase can be interpolated.

BRIEF DESCRIPTION OF THE DRAWINGS

FIG. 3 is a diagram showing known values of amplitude, frequency and phase of each spectrum which are provided with the high resolution frequency analyzer of the present invention and the conventional frequency analyzer.

DETAILED DESCRIPTION OF THE INVENTION

Figure 1:
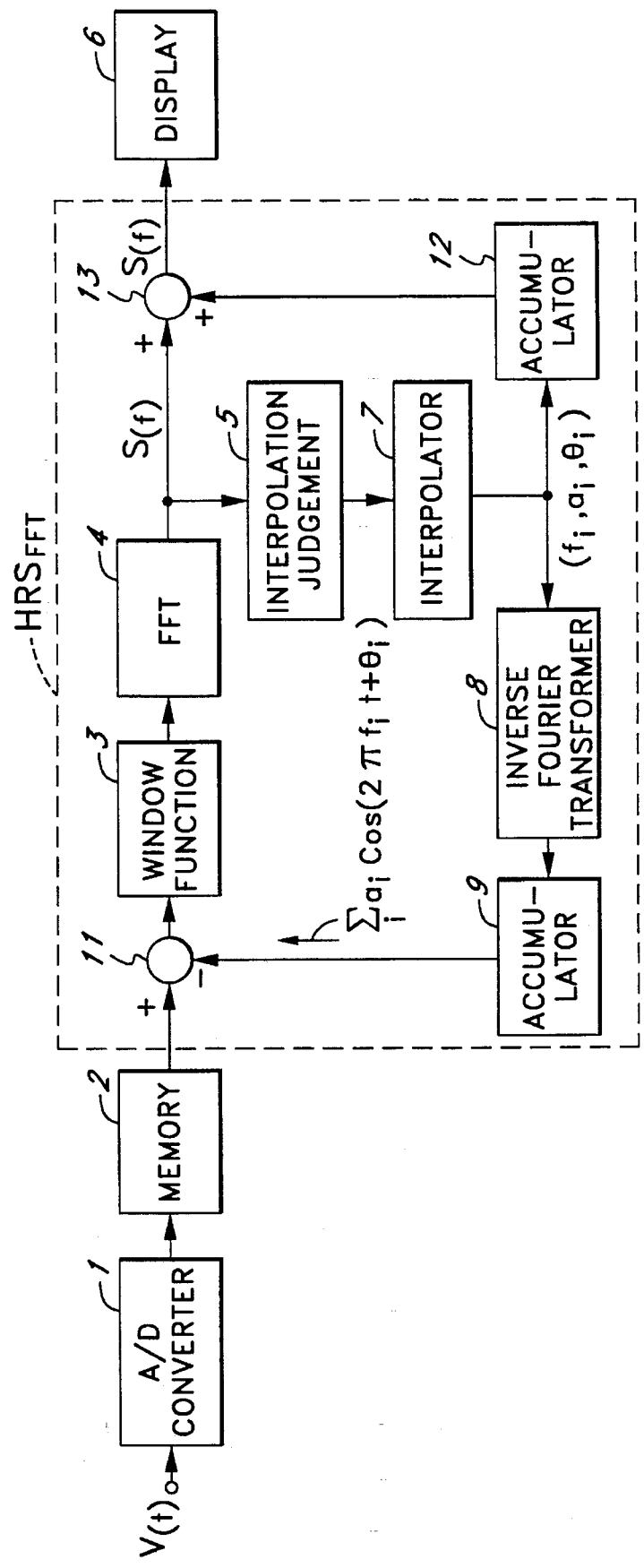
FIG. 1 is a block diagram showing one preferred embodiment of the present invention.

FIG. 1 shows the preferred embodiment of the high resolution frequency analyzer of the present invention. The high resolution frequency analyzer comprises an AD converter 1, memory 2, a window function weighting means 3, a FFT means 4 and a display device 6, which are identical to a conventional analyzer. The high resolution frequency analyzer is specified as $HRS_{FFT}$ and shown by the broken line in FIG. 1.

The present invention further comprises an interpolation judgment means 5, a spectrum interpolation means 7, an inverse Fourier transform means 8, a time-base accumulator 9, a subtractor 11, a frequency accumulator 12 and a summation means 13. The interpolation judgment means 5 is provided at the output side of FFT means 4. The spectrum interpolation means 7 executes the spectrum interpolation based on the interpolated results of the interpolation judgment means 5. The inverse Fourier transform means 8 inversely converts the frequency, amplitude and phase of the spectrum obtained by the spectrum interpolation means 7 into time base data. The time-base accumulator 9 accumulates the time base data which is inversely converted by the inverse Fourier transform means 8. The subtractor 11 subtracts the accumulated result from the time base data, which is read out from memory 2, and inputs the subtracted result into the window function weighting means 3. The frequency accumulator 12 accumulates the frequency domain data which is interpolated by the spectrum interpolation means 7. The summation means 13 sums the frequency domain data accumulated in the accumulator 12 and the frequency domain data S(f) obtained by FFTing the weighted time base data.

A spectrum analyzer, having a short analysis time period, has been conventionally used for analyzing frequency, amplitude and phase of a limited data series, such as communication data or image data. Primary analysis methods include Short Time Fourier Transform (STFT), wavelet transform and Maximum Entropy Method (MEM). These analysis methods are characterized as follows. First, since the STFT employs the FFT, it is easy to use and very fast. However, the quality of the frequency resolution is poor. Thus, the STFT is not suitable for phase analysis. Although it has been reported that the frequency interpolation method improves frequency precision and levels, this has not been satisfactorily proven with respect to adaptive judging and phase analysis. Second, although the wavelet transform is suitable for phase analysis, improved frequency resolution cannot be expected. Third, although the MEM is expected to have high frequency resolution, it is unable to perform phase analysis.

The present invention analyzes the STFT using the Hann window function and the interpolation judgment means for performing and achieving spectrum frequency interpolation. Thus, the present invention allows high frequency resolution and phase analysis to be performed over relatively short processing times.

The STFT is a frequency spectrum is expressed utilizing the input data series x(t), as shown in Equation 1.

$$STFT(f) = \int x(t)g(t)\exp(-j2\pi ft)dt \quad (2)$$

In this equation, the window function is g(t) and is used to extract or define a finite data series. There are several suggestions for the window function. The observed frequency spectrum STFT(f) becomes the convolution integral of X(f), which is the Fourier transform of x(t), and G(f), which is the Fourier transform of g(t).

If the Fourier transform X(f) and G(f) are expressed as shown in Equations 2–3, $$G(f) = \int g(t)\exp(-j2\pi ft)dt \quad (2)$$

$$STFT(f) = \int X(f-u)G(u)du \quad (3)$$

then, $$X(f) = \int x(t)\exp(-j2\pi ft)dt \quad (4)$$

In other words, if the input data train x(t) has a line spectrum $f_1, f_2, \ldots, f_n$, as expressed in Equation 5, and its interval is wider than the frequency band of the frequency spectrum G(f), then the frequency spectrum X(f) of the true input data series can be obtained from the observed frequency spectrum STFT(f).

$$x(t) = \sum_{i=1}^{m} a_i \cos(2\pi f_i t + \theta_i) \quad (5)$$

The requirements or conditions for the frequency spectrum G(f) of the window function are as follows. First, the energy spectrum frequency band of G(f) should be narrow for the separation of X(f). Second, the characteristics of the phase and frequency should be line-type for the phase analysis of X(f). Third, the amplitude of G(f) should be expressed in a simple equation in order to easily assume $f_i$ which is shown in Equation 5 from STFT(f).

In order to satisfy the above three conditions, the Hann window function is employed.

$$gh(t) = \begin{cases} 1 + \cos\left(\frac{2\pi t}{T}\right), \left(\frac{-T}{2} < t < \frac{T}{2}\right) \\ 0 \ldots \text{(Other Domain)} \end{cases} \quad (6)$$

$$Gh(f) = \left| \frac{0.5 \sin\left[\pi T\left(f - \frac{1}{T}\right)\right]}{\left[\pi T\left(f - \frac{1}{T}\right)\right]} + \frac{\sin(\pi Tf)}{(\pi Tf)} + \frac{0.5 \sin\left[\pi T\left(f + \frac{1}{T}\right)\right]}{\left[\pi T\left(f + \frac{1}{T}\right)\right]} \right| \quad (7)$$

Figure 2:
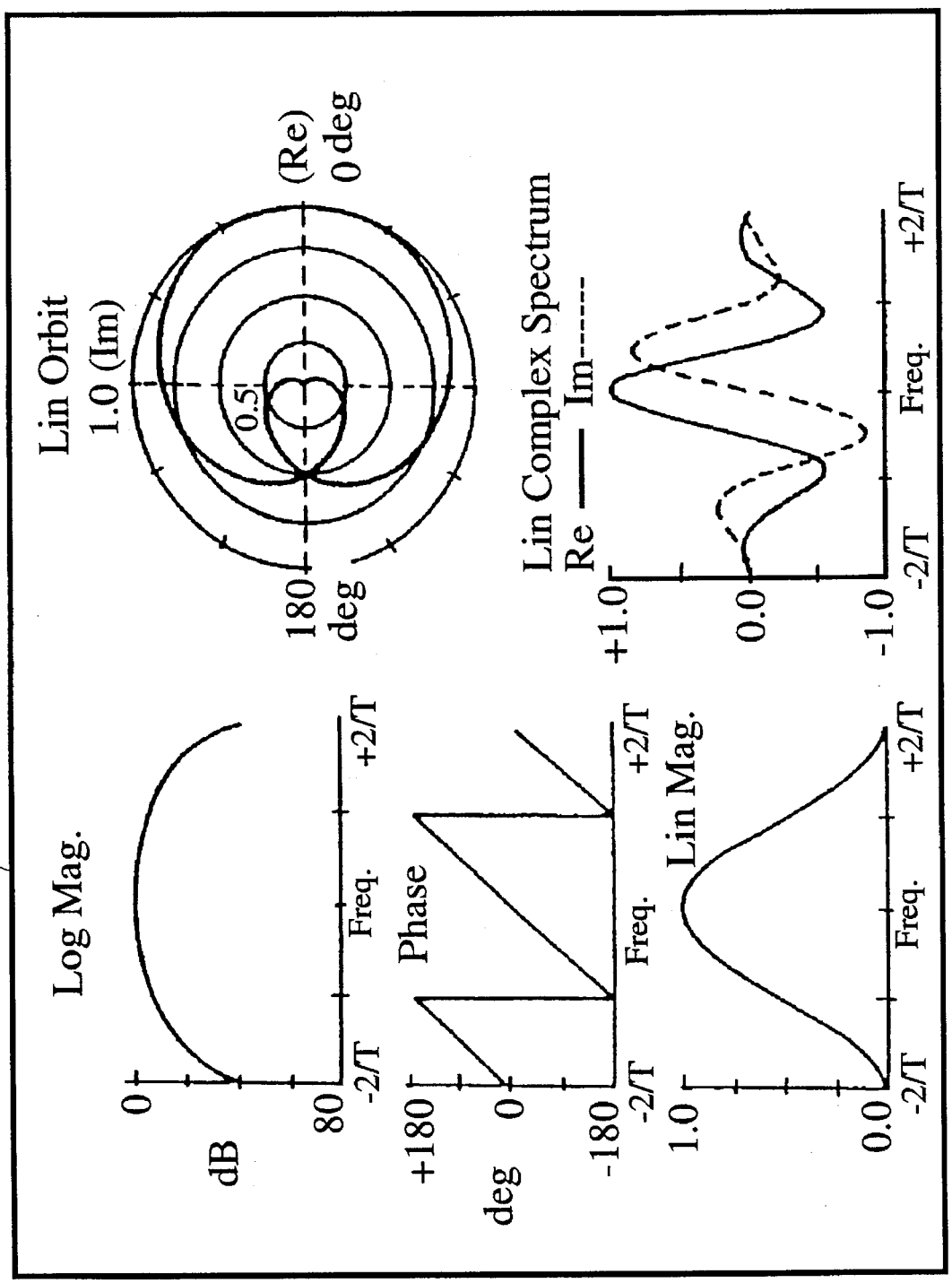
FIG. 2 shows an example of the frequency spectrum of the Hann window function which is used in the high resolution frequency analyzer of the present invention.

Equation 6 expresses the Hann window function. Equation 7 expresses the frequency spectrum amplitude of Equation 6. FIG. 2 illustrates the Fourier transform result of Equation 6 for the frequency range of "−2/T<f<2+/T". The abbreviations used in FIG. 2 are defined as follows: "Log Mag" is the abbreviation for logarithmic intensity; "Phase" is the abbreviation for phase characteristics; "Lin" is the abbreviation for linear intensity; "Orbit" is the abbreviation for vector locus; and "Re-Im . . . " is the abbreviation for real numbers and imaginary numbers. Equation 8 shows an alternate expression for Gh(f), which is similar in formate to Equation 6.

$$Gh(f) \equiv \begin{cases} \left[ \text{Amplitude: } 0.5 \left[ 1 + \cos\left(\frac{\pi Tf}{2}\right) \right] \right], \\ \text{Phase: } \pi Tf \\ \text{Amplitude: } 0 \ldots \text{(Other Domain)} \end{cases} \quad (8)$$

$$\left( \frac{-2}{T} < f < \frac{2}{T} \right)$$

Thus, Equation 8 is very accurate in the frequency range of "$-1/T \leq f \leq 1/T$".

From the foregoing description, it may be easy to understand that the Hann window function is the most suitable window function for the window function weighting means 3. The input data series which is read out from memory 2 is weighted in accordance to the Hann window function in the window function weighting means 3. After the noise is removed, it is Fast Fourier Transformed (FFTed) by the FFT 4.

The frequency domain data STFT(f), which is FFTed by the Hann window function, is the discrete frequency spectrum computed utilizing the FFT algorithm. It is easy to analyze the true spectrum frequency, amplitude and phase ($f_i$, $a_i$, and $\theta_i$ in Equation 5) from this spectrum series by using Equations 4 and 8. Namely, three spectrum amplitudes and phases measured in the vicinity of $f_i$ are obtained by Equations 9–11.

$$STFT\left(\frac{n-1}{T}\right) \equiv \begin{cases} \text{Amplitude: } \frac{a_i}{2} \left[ 1 - \sin\left[\frac{\pi T \Delta f_i}{2}\right] \right] \\ \text{Phase: } \theta_1 + \pi(T\Delta f_i - 1) \end{cases} \quad (9)$$

$$STFT\left(\frac{n}{T}\right) \equiv \begin{cases} \text{Amplitude: } \frac{a_i}{2} \left[ 1 + \cos\left[\frac{\pi T \Delta f_i}{2}\right] \right] \\ \text{Phase: } \theta_1 + \pi T \Delta f_i \end{cases} \quad (10)$$

$$STFT\left(\frac{n+1}{T}\right) \equiv \begin{cases} \text{Amplitude: } \frac{a_i}{2} \left[ 1 + \sin\left[\frac{\pi T \Delta f_i}{2}\right] \right] \\ \text{Phase: } \theta_1 + \pi(T\Delta f_i - 1) \end{cases} \quad (11)$$

$$\Delta f_i = f_i - n/T(-0.5/T \leq \Delta f_i < 0.5/T) \quad (12)$$

Reference symbol "n" is an integer. If n is found to be interpolative, the frequency $f_i$, amplitude $a_i$ and phase $\theta_i$ of the true spectrum can be obtained utilizing the interpolation process. The following steps should be performed in order to execute the interpolation process:

Step 1: Obtain three spectrums as defined by Equations 9–11.

Step 2: Compare the phases which are defined in Equations 9 and 11. If the difference between both phases is less than a predetermined value ($\pi/36$ radian), then it is said to be interpolative and the spectrum interpolation means 7 is subsequently activated. If the difference between both phases is more than the predetermined value ($\pi/36$ radian), then it is said to be a discrete spectrum due to the fluctuation and 1 is added to n and Steps 1 and 2 are repeated.

Step 3: Add the amplitude defined in Equations 9 and 11 to the amplitudes obtained utilizing the spectrum interpolation means 7 in order to get the true amplitude $a_i$ of the line spectrum.

Step 4: Subtract $a_i/2$ from the amplitude of Steps 1–3, respectively, in order to obtain $\Delta f_i$. Then, calculate the true frequency $f_i$ from $\Delta f_i$ using Equation 13.

$$f_i = n/T + \Delta f_i \quad (13)$$

Step 5: Calculate the true phase $\theta_i$ (absolute phase) from the phase expressed in Equation 10 and $\Delta f_i$.

$$\theta_i = STFT(n/T)_{phase} - \pi T \Delta f_i \quad (14)$$

After the frequency $f_i$, amplitude $a_i$ and phase $\theta_i$ of the true spectrum are obtained from the spectrum interpolation means 7, the frequency domain data is transferred to the single spectrum inversion Fourier transformer 8 so as to invert the single line spectrum into the time base data. Then, the time base data is transferred to and accumulated by the accumulator 9.

The time base data accumulated in the accumulator 9 is transferred to the subtractor 11 and subtracted from the data series which is read from memory 2. The data obtained from the subtraction process is FFTed again by the FFT 4. Thus, the three spectrums defined by Equations 9–11 are basically removed and the frequency domain data of the true spectrum is accumulated in the accumulator 12.

The judging and interpolation processes are performed from n=2 to n=k–1 (wherein k represents ½ of the time domain data). The frequency domain data of the true spectrum which is accumulated in the accumulator 12 is vector-summed to the FFTed data utilizing the summation means 13. Then, the summed result is displayed on the display device 6.

As described in the foregoing, according to the function of the high resolution frequency analyzer $HRS_{FFT}$ used in the present invention, if three frequency spectrums exist next to each other among the discrete frequency spectrums obtained by the Fourier transform, and if the phase of the top and bottom spectrum are within the allowed value, then these three frequency spectrums are found to be the true, discrete line spectrums. The frequency $f_i$, amplitude $a_i$ and phase $\theta_i$ of the true spectrum are obtained using the interpolation process. The true line spectrum data is accumulated in the accumulator 12 and inversely converted to the time base data by the inverse Fourier transform means. The time base data is accumulated by the accumulator 9 and subtracted from the input data series. After determining the true line spectrum via the interpolation process, the remaining energy is lowered. Thus, the line spectrum is not spread out but, rather, is displayed as a spectrum of lines. As a result, the resolution of the spectrum is improved. Further, since the amplitude and phase are calculated close to the true value, the amplitude and phase can be accurately measured.

Figure 4:
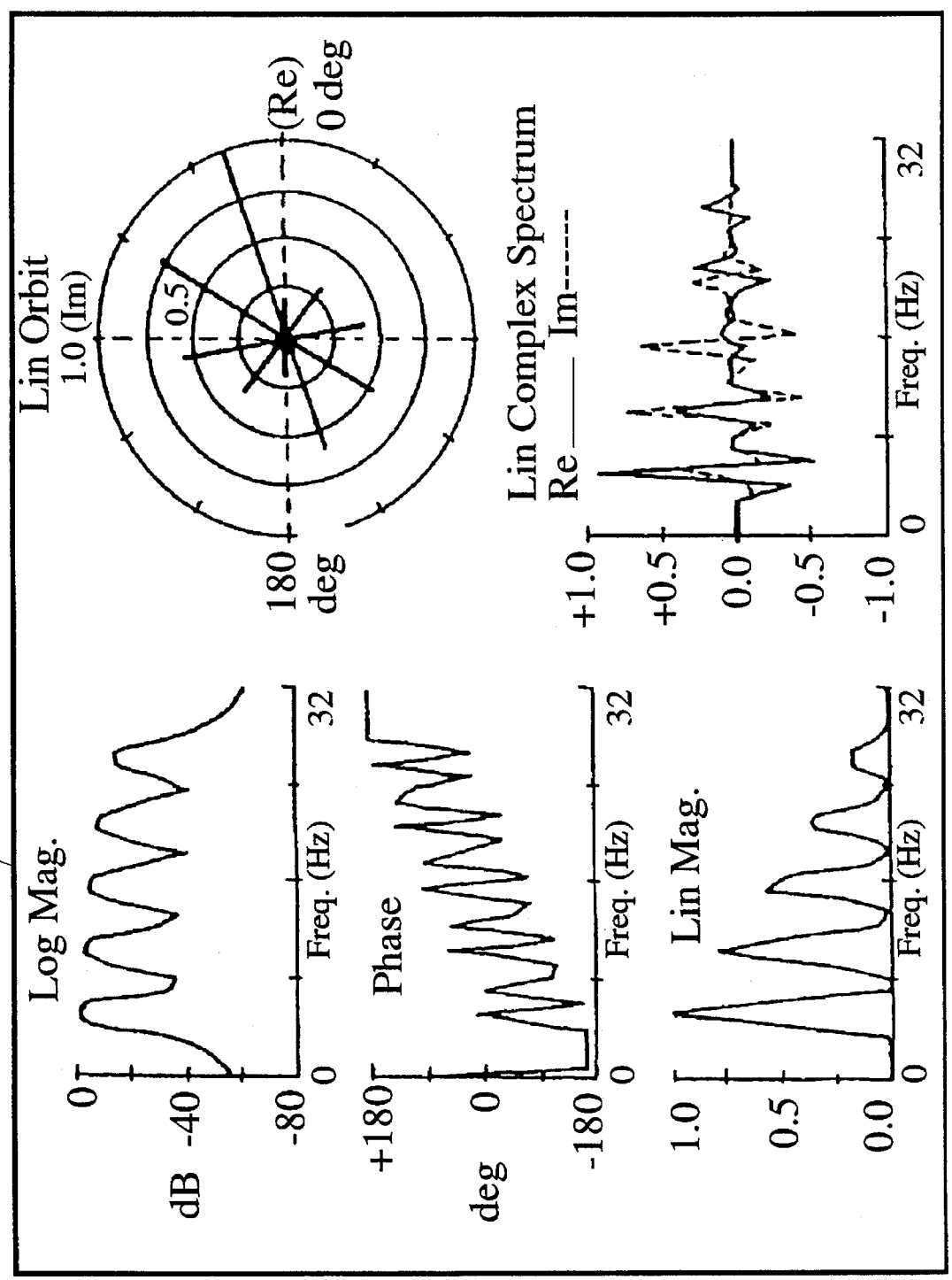
FIG. 4 shows a result displayed on the display device when a signal having a known spectrum, as shown in FIG. 3, is input to the conventional frequency analyzer.
Figure 5:
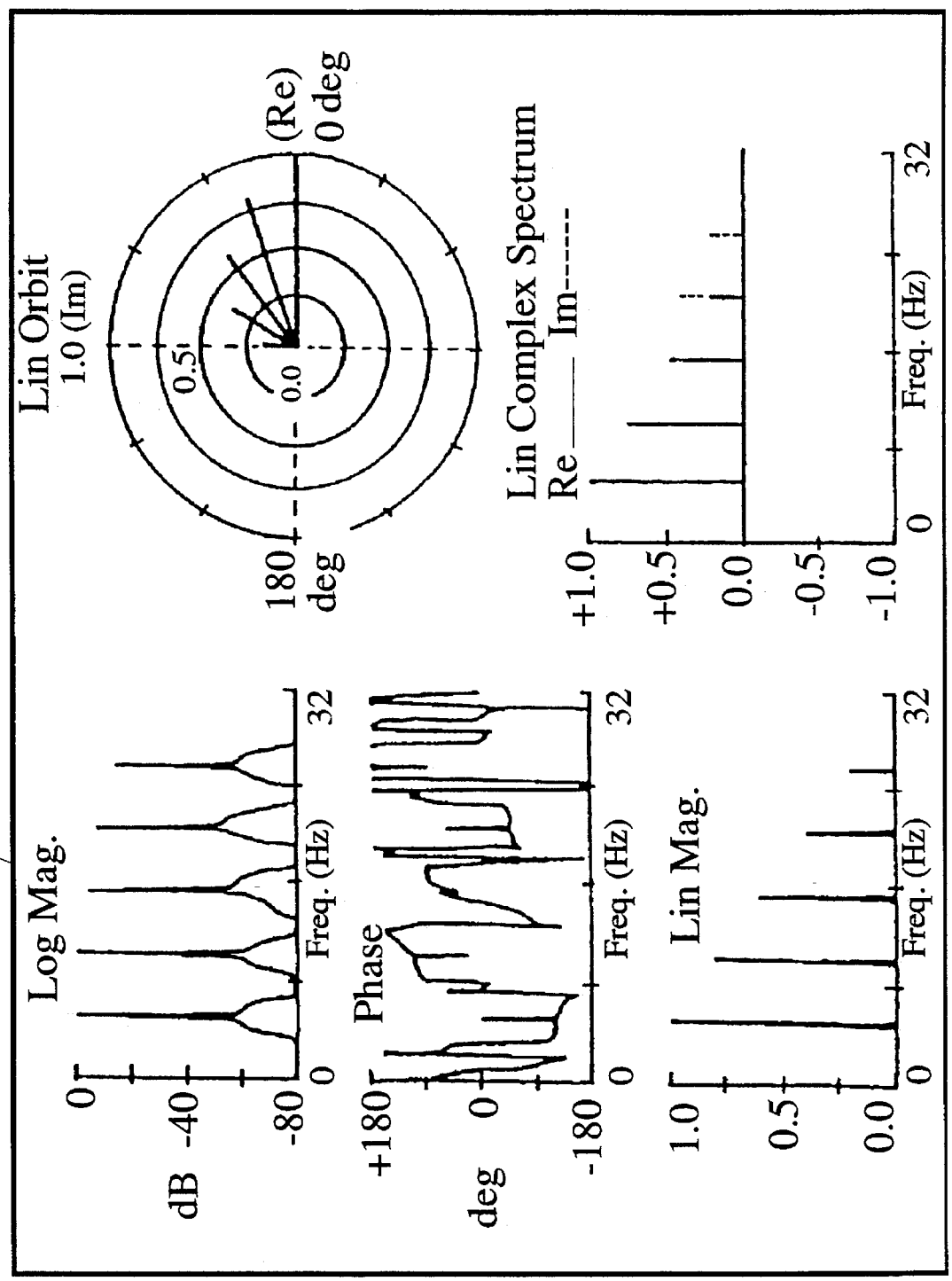
FIG. 5 shows a result displayed on the display device when a signal having known spectrum, as shown in FIG. 3, is input to the high resolution frequency analyzer of the present invention.

FIGS. 4 and 5 show the results of the STFT spectrum analysis of x(t), which samples the data series as 64 points when T=1(sec), using a conventional frequency analyzer and the high resolution spectrum analyzer of the present invention, respectively, when known values of the amplitude $a_i$, frequency $f_i$ (Hz) and phase $\theta_i$ (deg), shown in FIG. 3, are substituted in Equation 15.

$$x(t) = \sum_{i=1}^{5} a_i \cos(2\pi f_i t + \theta_i) \quad (15)$$

FIG. 4 shows the results of the STFT spectrum analysis of the Hann window function. The analysis spectrum is spread out and the level of the amplitude $a_i$ is inaccurate compared to the input value. Because of these inaccuracies, it is not significant to analyze the phase.

FIG. 5 shows the results of the spectrum analysis using the high resolution frequency interpolation method of the present invention. This analysis is performed based upon the interpolation from n=2 to n=(64/2)−1, in accordance with the spectrum interpolation. The frequency $f'_i$, amplitude $a'_i$ and phase $\theta'_i$ are successively obtained from the true spectrum. Its signal element is subtracted from x(t) so as to obtain the remainder data as defined in Equation 16.

$$x'(t) = x(t) - \sum_{i=1}^{5} a'_i \cos(2\pi f'_i t + \theta'_i) \quad (16)$$

FIG. 5 shows the result of the vector summation of a FFT spectrum of 512 points, in which the remainder data obtained from Equation 16 is extended at zero charge, and the true line spectrum is obtained by interpolation. As shown by the diagram, the remaindering energy is extremely low and the spectrum resolution is very high, which is expected when using the frequency interpolation method of the present invention. Further, the amplitude value $a_i$ is very accurate and the phase is correctly analyzed. Analysis errors of the frequency $f_i$, amplitude $a_i$ and phase $\theta_i$ are smaller than 0.01(Hz), 1% and 1(deg), respectively.

Figure 6:
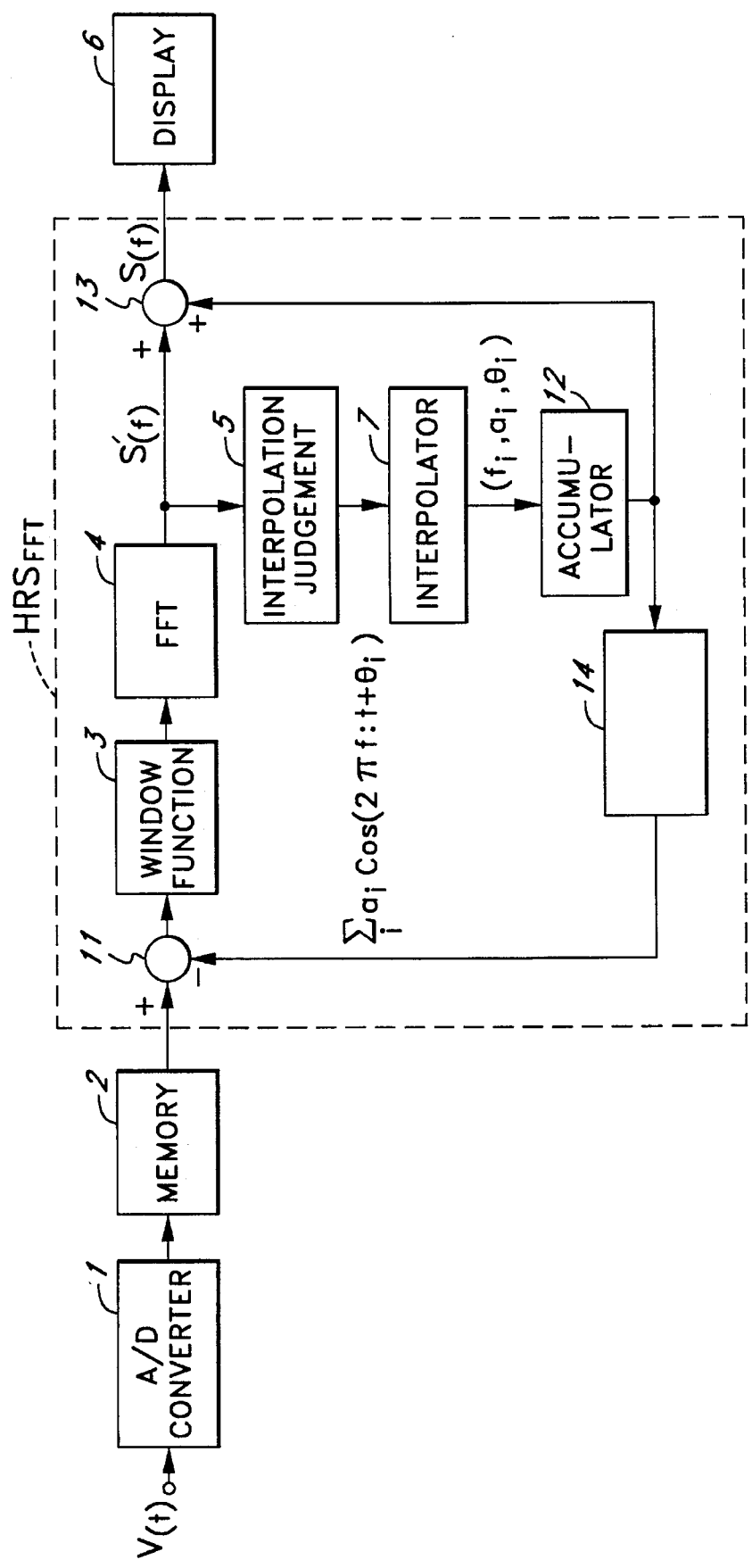
FIG. 6 is a block diagram showing a modified embodiment of the high resolution frequency analyzer of the present invention, shown in FIG. 1.

In the foregoing embodiment, the results of the spectrum interpolation are separately accumulated in the accumulators 9 and 12. However, it is also possible to provide the accumulator 12 with only the output side of the vector interpolation means 7, as shown in FIG. 6, so that the interpolated results are solely accumulated in the accumulator 12. For this case, an entire spectrum inversion Fourier transform means 14 is used so as to Fourier-invert the entire accumulated spectrum.

Although it has not been described in the foregoing embodiment, a low pass filter can be added in front of the AD converter in order to remove sampling aliasing errors. Modifications to the transmission function (i.e., frequency characteristics of the amplitude and phase) may be performed on the input signals.

Figure 7:
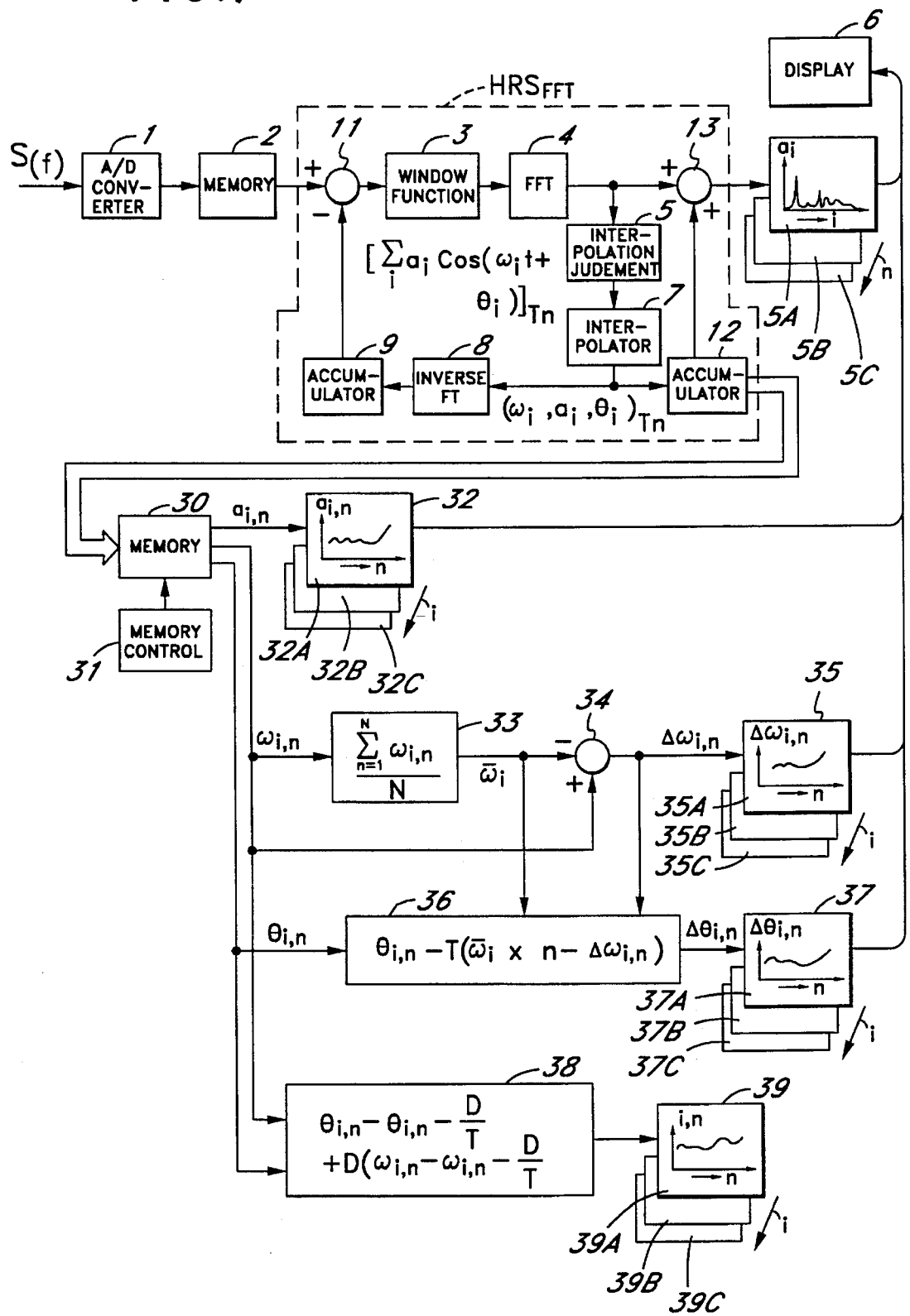
FIG. 7 is a block diagram showing one example in which the high resolution frequency analyzer of the present invention is applied to a vector spectrum analyzer.

FIG. 7 shows an alternate embodiment of the present invention. This embodiment comprises a vector spectrum analyzer which measures the operational characteristics of a multi-channel transmitter or a multi-channel receiver, such as a cellular phone, for all channels simultaneously. For example, the signals received from all channels from the multi-channel receiver are considered to be input signals S(t). The signals are AD-converted by the AD converter 1 and stored in memory 2 for a predetermined period of time. The input data series stored in memory 2 is input to the high resolution frequency analyzer $HRS_{FFT}$ and its frequency is analyzed in the high resolution mode.

The display device 6 is provided with multiple screens for image memories 5A–5C. The frequency spectrum for each input data series taken from memory 2 is stored in the image memories 5A–5C. In other words, the frequency spectrums of the received signals are input into the image memories 5A–5C. Further, the time changes for the frequency spectrums are respectively transferred to the image memories 5A–5C. The frequency spectrums transferred to the image memories 5A–5C are displayed on the display device 6, one frequency spectrum or image memory per screen. Additionally, multiple frequency spectrums can be displayed simultaneously on the same screen due to multi-window capabilities.

Alternatively, the present invention may be characterized by the following. The frequency domain data ($a_i$, $\omega_i$ and $\theta_i$)Tn which is accumulated in the accumulator 12 of the high resolution frequency analyzer $HRS_{FFT}$ is transferred to memory 30. Next, the frequency domain data ($a_i$, $\omega_i$ and $\theta_i$)Tn is read for each channel per "i", wherein "i" represents the number of each spectrum and "n" represents the time. The amplitude data ($a_i$, n) for each channel is transferred into the amplitude time change memory 32 and the frequency data ($\omega_i$, n) is transferred into the frequency time change memory 35. In addition, the phase data ($\theta_i$, n) is transferred into the phase time change memory 37.

Further, the inspection output power of a delaying phase detector 38 is transferred into the delaying phase detection analysis memory 39. The data transferred into each memory 32, 35, 37 and 39 is finally displayed by the display device 6.

For example, the amplitude data ($a_i$, n), frequency data ($\omega_i$, n) and phase data ($\theta_i$, n), in connection with the first channel i=1, are read by a read control device 31 from the frequency domain data ($a_i$, $\omega_i$ and $\theta_i$) which is transferred into memory 30. The amplitude data ($a_i$, n) is transferred into an image memory 32A of the amplitude time change memory 32. Amplitude time changes for each channel are stored by writing in each amplitude data ($a_i$, n) for i=2, 3 . . . in the image memories 32B—32C.

Further, the frequency data ($\omega_i$, n) is reproduced as a carrier wave [ω bar] using a carrier wave reproducer 33. The carrier wave [ω bar] and the frequency data ($\omega_i$, n) are then subtracted by the subtractor 34 and the frequency conversion ($\Delta\omega_i$, n) is obtained from the center frequency. The frequency conversion ($\Delta\omega_i$, n) is stored in the image memory 35A which is provided in the frequency time change memory 35. Thus, frequency conversions for each channel can be stored by storing each frequency conversion ($\Delta\omega_i$, n) of i=2, 3 . . . in the image memories 35B—35C.

In addition, the phase data ($\theta_i$, n) is transferred to a relative phase processor 36, and the relative phase is computed. For this computation, the carrier wave element [ω bar] is removed from the output side of the carrier wave reproducer 33. The frequency conversion ($\Delta\omega_i$, n), obtained from the center frequency, is removed from the output side of the subtractor 34. Then, {$\theta_i$, n−T ([ω bar] , n−$\Delta\omega_i$, n) } is computed and the phase change ($\Delta\theta_i$, n) is calculated. Further, the calculated result is written into the image memory 37A of the phase time change memory 37. Accordingly, the phase changes ($\Delta\theta_i$, n) for each channel are subsequently written into the image memories 37B–37C.

Furthermore, if a different phase modulation signal exists, the delaying phase detector 38 is used to demodulate the different phase modulation signal. The demodulation can be obtained from Equation 17, wherein "D" represents delayed seconds and "T" represents a time interval for transferring data into memory 30 (i.e., a sampling time interval).

$$\theta_{i,n} - \theta_{i,n-D/T} + D(\omega_{i,n} - \omega_{i,n-D/T}) \quad (17)$$

The demodulated output power is then written into image memory 39A, contained within the delaying phase detection analyzing memory 39.

The present invention allows one to display the amplitude time change ($a_i$, n) for each channel, the frequency time change ($\Delta\omega_i$, n) from the center frequency, the phase time change ($\Delta\theta_i$, n) and the result of the delaying phase detection analysis by transferring each image data stored in memory 32, 35, 37 and 39 to the display device 6. For this display, the amplitude time change ($a_i$, n) for multiple channels can be displayed on the same screen of the common display device 6 due to multi-window capabilities. In addition, each changing characteristic of the channel can be displayed on the same screen.

Figure 8:
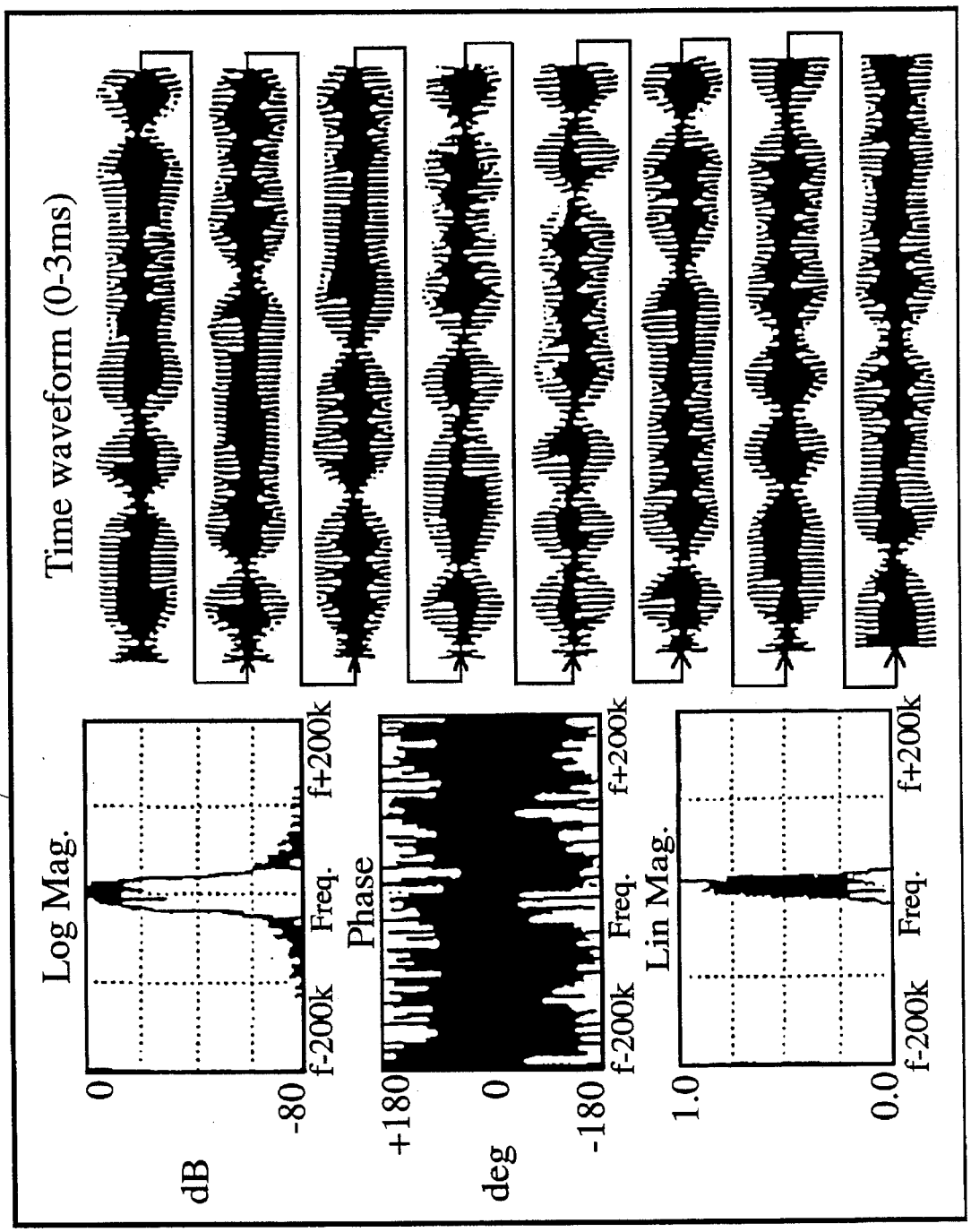
FIG. 8 shows an analysis result displayed on the display device when an application, such as the example shown in FIG. 7, is executed by the conventional invention.

FIG. 8 shows the result of the frequency analysis for a π/4 shift DQPSK wave which is passed through a root-Nyquist filter using a conventional analyzer. The eight waveforms shown on the right side of the screen are in sequential order and were taken within 0–3 milliseconds. Thus, as shown by FIG. 8, the spectrum is spread out and the resolution is very poor.

Figure 9:
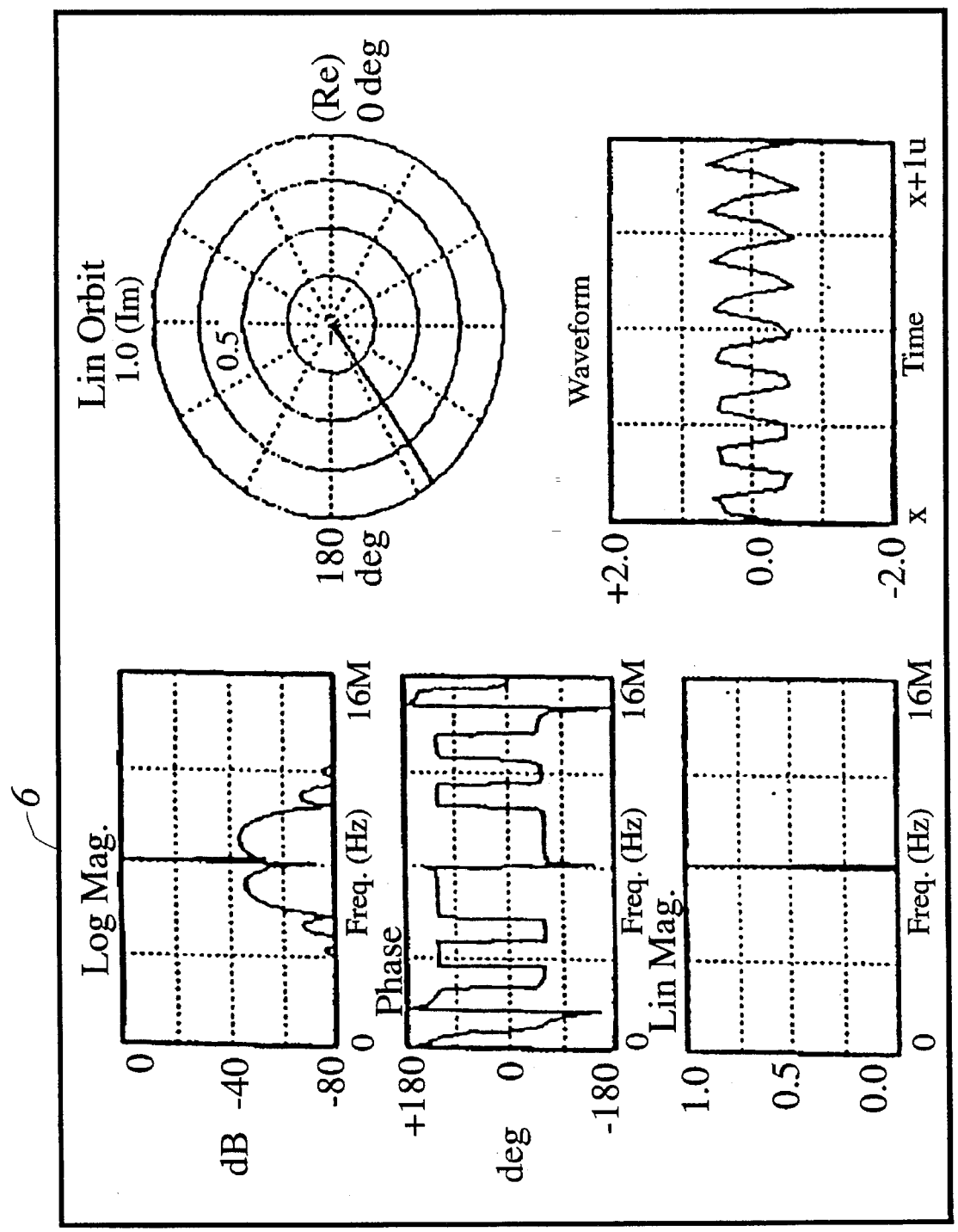
FIG. 9 shows an analysis result for a partial spectrum of an application, such as the example shown in FIG. 7, displayed on the display device.

FIG. 9 shows the analysis result of the vector spectrum analyzer utilizing the high resolution frequency analyzer $HRS_{FFT}$ of the present invention. FIG. 9 shows the spectrum of one channel stored in any one of the image memories 5A–5C. As shown in the drawing, the spectrum is displayed as a line spectrum. Further, since it can be measured in a short period of time, the carrier wave is consistently displayed on the "Waveform" screen.

Figure 10:
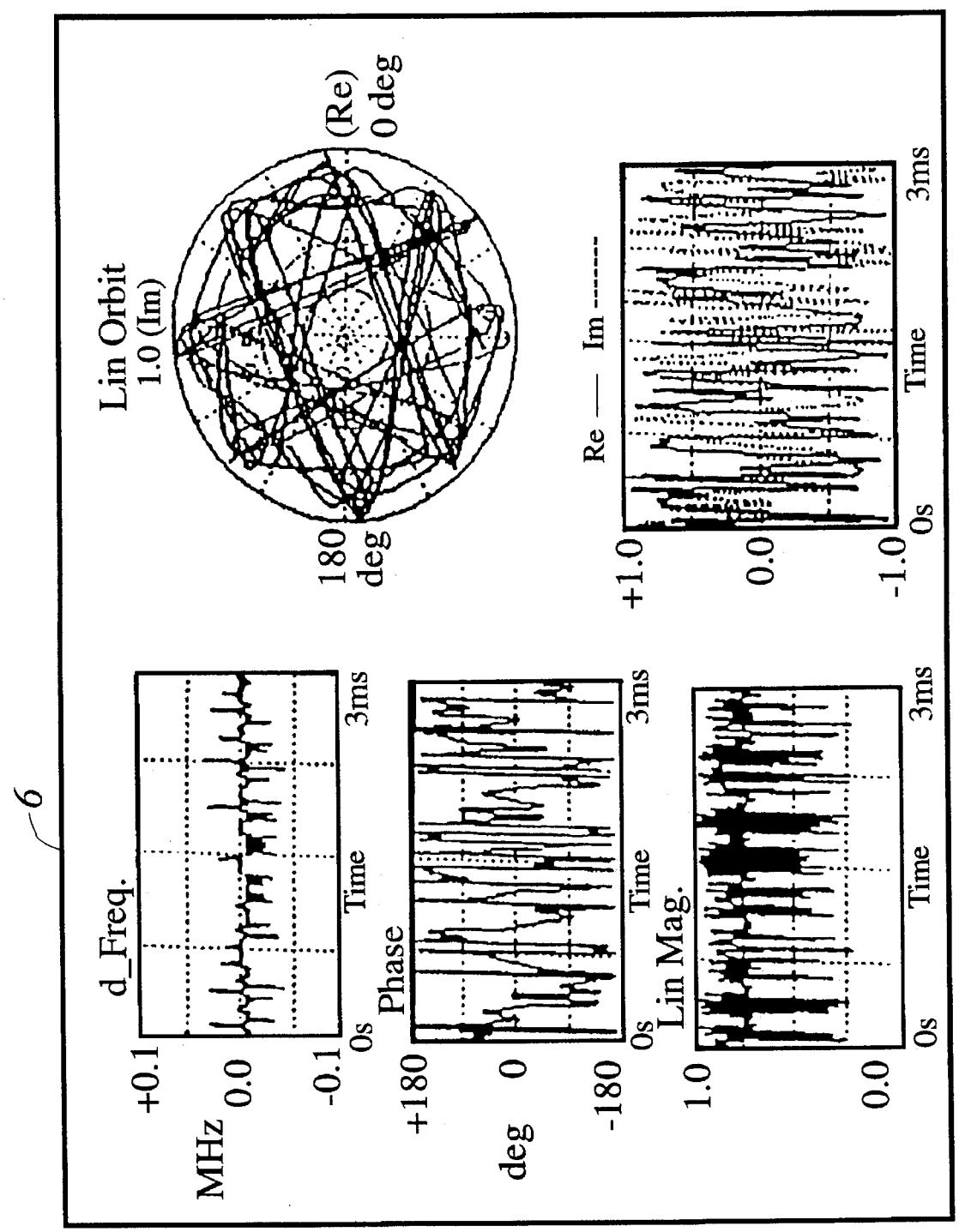
FIG. 10 shows a vector spectrum analysis result of an application, such as the example shown in FIG. 7, displayed on the display device.
Figure 11:
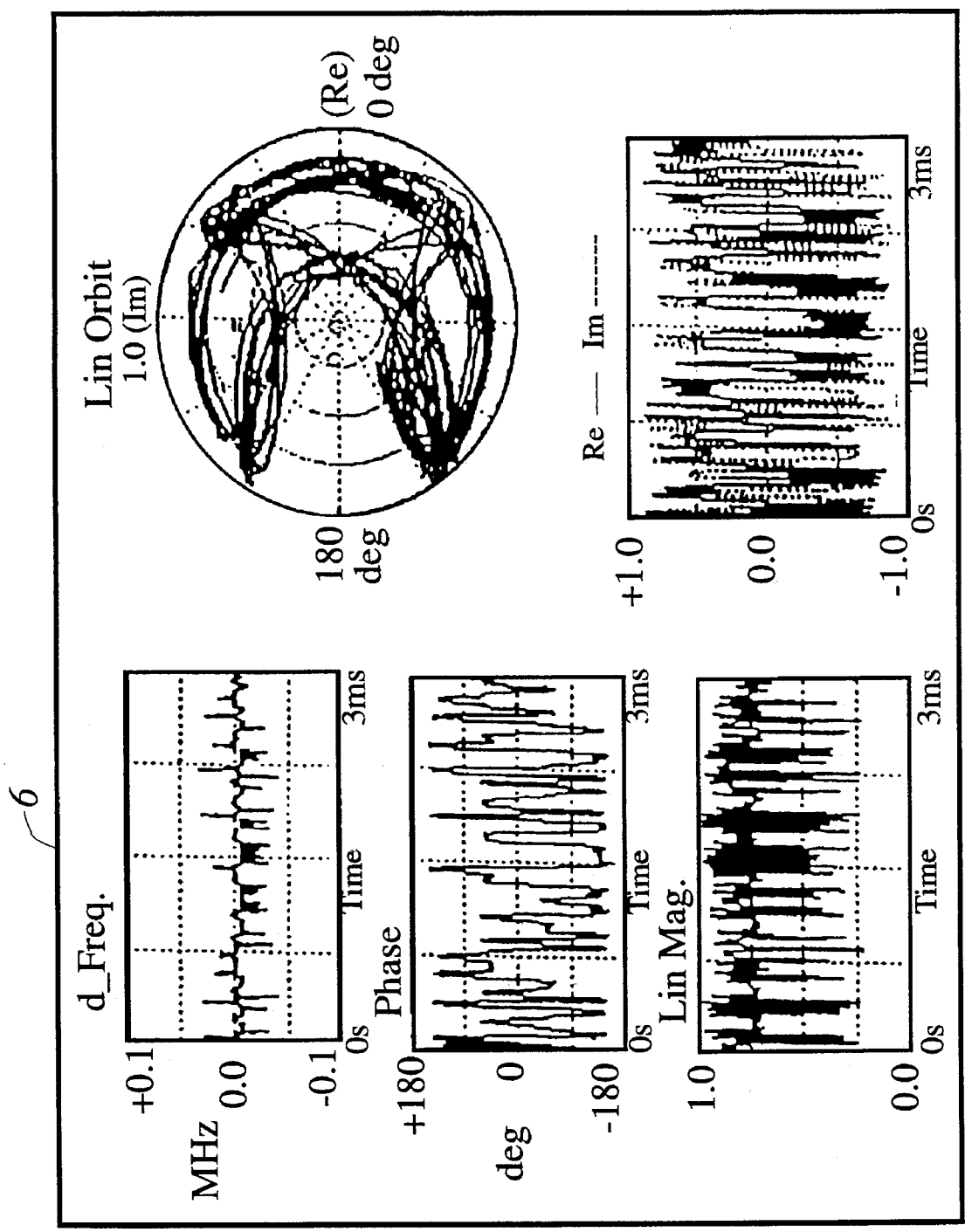
FIG. 11 shows a delayed detection analysis result of an application, such as the example shown in FIG. 7, displayed on the display device.
Figure 12:
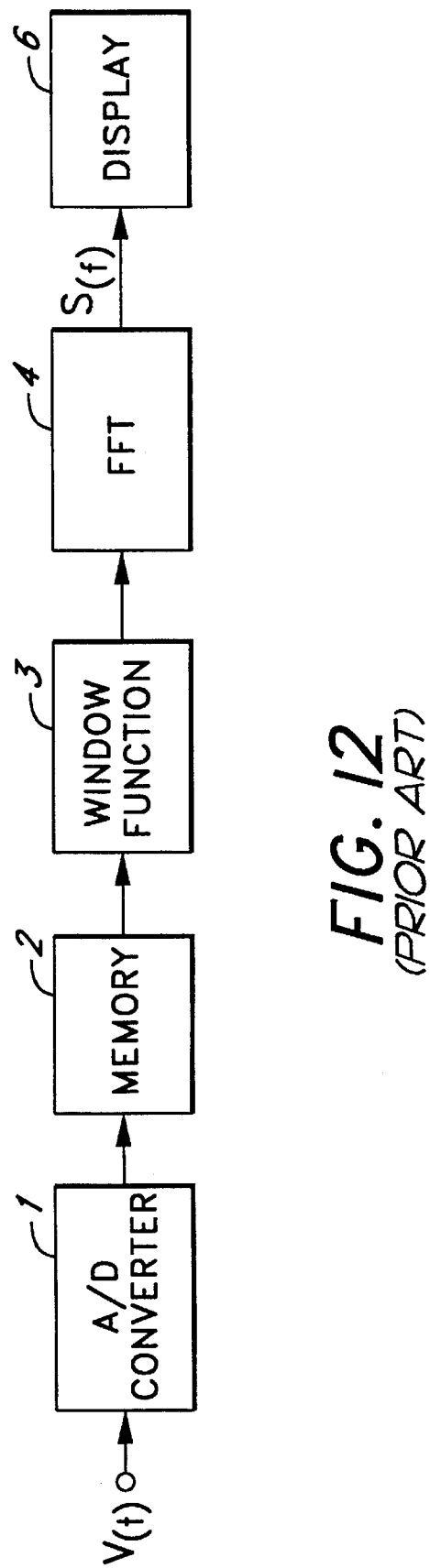
FIG. 12 is a block diagram illustrating the conventional frequency analyzer.

FIG. 10 shows the analysis result of the vector spectrum. The "d Freq" screen shows the conversion $(\Delta \omega_i, n)$ from the center frequency of the carrier wave for one channel which is stored in any one of the image memories 35A, 35B . . . of the frequency time change memory 35, shown in FIG. 7. Further, the "Phase" screen shows the phase time change $(\Delta \theta_i, n)$ for one channel which is stored in any one of the image memories 37A, 37B, 37C . . . of the phase time change memory 37, shown in FIG. 7. FIG. 11 shows the result of the delayed detection analysis when the high resolution frequency analyzer of the present invention is applied to a vector spectrum analyzer.

According to these embodiments, the data transferred into memory 32, 35, 37 and 39 is obtained by utilizing the frequency domain data which is accumulated in the accumulator 12, provided by the high resolution frequency analyzer $HRS_{FFT}$ of the present invention. Thus, the data consists of the true line spectrums only, which are obtained using the interpolation process. As a result, the data does not include the spread out spectrum caused by fluctuations which are faster than the data rate. Thus, only the true transmission data is displayed on the display device 6. Therefore, the true transmission characteristics can be obtained.

As described above, the high resolution frequency analyzer $HRS_{FFT}$ of the present invention allows one to distinguish between the true line spectrum and the dispersed spectrum, which results from fluctuations. According to the present invention, with respect to the true line spectrum, the true frequency, amplitude and phase are determined through computations based on the interpolation process and, subsequently, the accurate spectrum can be obtained.

Moreover, by utilizing the high resolution frequency analyzer of the present invention, it is possible to obtain a hologram reproducing device or a vector spectrum analyzer which can measure the transmission characteristics of multi-channels. Additionally, the present invention can be applied to other devices.

Obviously, numerous variations and modifications can be made without departing from the spirit of the present invention. Therefore, it should be clearly understood that the forms of the present invention described above and shown in the figures of the accompanying drawings are illustrative only and are not intended to limit the scope of the present invention.

What is claimed is:

1. A high resolution frequency analyzer for obtaining frequency spectrum of an incoming signal and displaying the frequency on a display, comprising:

a subtractor for subtracting input digital data from the other input digital data and generating resulted digital data at its output;

a fast Fourier transformer receiving said resulted digital data from said subtractor for transforming discrete digital data to a frequency spectrum;

an interpolation judgment circuit which distinguishes a line spectrum from a dispersed spectrum in each frequency spectrum obtained by said fast Fourier transformer and determines that said frequency spectrum be interpolated when a true line spectrum is found;

a spectrum interpolator which produces frequency domain data by estimating a true frequency, amplitude and phase of said frequency spectrum that has been determined by said interpolation judgment circuit to be interpolated;

an inverse Fourier transformer which inversely converts said frequency domain data produced by said spectrum interpolator into time base data, said inverse Fourier transformer being provided in a feedback loop to provide said time base data to said subtractor;

a first accumulator for accumulating said frequency domain data produced by said spectrum interpolator; and an adder for vector-summing said frequency domain data accumulated by said accumulator to said frequency spectrum from said fast Fourier transformer and providing the resulted frequency spectrum to said display.

2. The high resolution frequency analyzer as defined in claim 1 further includes:

an AD converter for successively converting an incoming analog signal to be frequency analyzed to a series of digital data; and a memory for successively storing said digital data and generating said digital data, said digital data being applied to said subtractor.

3. The high resolution frequency analyzer as defined in claim 1 further includes a window function weighting circuit which is provided between said subtractor and said fast Fourier transformer for multiplying said digital input data series by predetermined window function.

4. The high resolution frequency analyzer as defined in claim 1 further includes a second accumulator which is provided in said feedback loop between said subtractor and said inverse Fourier transformer for accumulating said time base data from said inverse Fourier transformer.

5. The high resolution frequency analyzer as defined in claim 1, wherein said first accumulator provides said frequency domain data produced by said spectrum interpolator both to said inverse Fourier transformer and said adder.

6. The high resolution frequency analyzer as defined in claim 1, wherein said interpolation judgment circuit which distinguishes said line spectrum from said dispersed spectrum by monitoring three adjacent frequency spectra (n−1, n, n+1) from said fast Fourier transformer, when a phase difference between said spectra (n−1, n+1) is within $\pi/36$ (radian), said frequency spectrum (n) is regarded as a line spectrum so that the estimation of said frequency domain data is proceeded by said interpolator.

7. A vector spectrum analyzer for obtaining vector frequency spectrum of an incoming signal and displaying the vector frequency on a display, comprising:

a subtractor for subtracting input digital data from the other input digital data and generating resulted digital data at its output;

a fast Fourier transformer receiving said resulted digital data from said subtractor for transforming discrete digital data to a frequency spectrum;

an interpolation judgment circuit which distinguishes a line spectrum from a dispersed spectrum in each frequency spectrum obtained by said fast Fourier transformer and determines that said frequency spectrum be interpolated when a true line spectrum is found;

a spectrum interpolator which produces frequency domain data by estimating a true frequency, amplitude and phase of said frequency spectrum that has been determined by said interpolation judgment circuit to be interpolated;

an inverse Fourier transformer which inversely converts said frequency domain data produced by said spectrum interpolator into time base data, said inverse Fourier transformer being provided in a feedback loop to provide said time base data to said subtractor;

a accumulator for accumulating said frequency domain data produced by said spectrum interpolator;

an adder for vector-summing said frequency domain data accumulated by said accumulator to said frequency spectrum from said fast Fourier transformer and providing the resulted frequency spectrum to said display;

a spectrum data memory for storing said frequency domain data accumulated by said accumulator;

a read-out controller for controlling a read-out operation in said spectrum data memory to extract amplitude data, frequency data, and phase data of each frequency spectrum in said frequency domain data;

wherein each of said amplitude data, frequency data and phase data is separately displayed on said display in a time sequence manner.

8. The vector spectrum analyzer as defined in claim 7 further includes:

an amplitude time change memory for storing said amplitude data from said spectrum data memory with respect to time sequence;

a frequency time change memory for storing said frequency data from said spectrum data memory with respect to time sequence; and a phase time change memory for storing said phase data from said spectrum data memory with respect to time sequence.

9. The vector spectrum analyzer as defined in claim 7 wherein each of said amplitude time change memory, frequency time change memory and phase time change memory is formed of a plurality of memories to produce a time varying display of said amplitude, frequency and phase data on said display.

10. The vector spectrum analyzer as defined in claim 7, wherein said interpolation judgment circuit which distinguishes said line spectrum from said dispersed spectrum by monitoring three adjacent frequency spectra (n−1, n, n+1) from said fast Fourier transformer, when a phase difference between said spectra (n−1, n+1) is within $\pi/36$ (radian), said frequency spectrum (n) is regarded as a line spectrum so that the estimation of said frequency domain data is proceeded by said interpolator.

* * * * *